Nov. 25, 1969 D. E. TSCHUDI 3,480,799

PULSE GENERATOR HAVING FAST RISE TIME

Filed Sept. 28, 1966

INVENTOR
DENNIS E. TSCHUDI
BY
Robert C. Smith
ATTORNEY

United States Patent Office 3,480,799

Patented Nov. 25, 1969

3,480,799

PULSE GENERATOR HAVING FAST RISE TIME

Dennis E. Tschudi, Lake View Terrace, Calif., assignor to The Bendix Corporation, a corporation of Delaware Filed Sept. 28, 1966, Ser. No. 582,620
Int. Cl. H03k 3/28
U.S. Cl. 307—273 8 Claims

ABSTRACT OF THE DISCLOSURE

A circuit is disclosed for producing high current amplitude pulse signals having extremely fast rise times and sharp cut-off characteristics. A tunnel diode and a resistor are connected across the input to a pair of regeneratively coupled transistors. The direct current power source is connected through a dropping resistor to the transistors and to a capacitor connected in series with an output resistor. The value of the dropping resistor is such that, in the absence of an input pulse, the input transistor is maintained in quiescent condition, while a charge is accumulated on the capacitor. When an input pulse appears across the tunnel diode it is driven into its negative resistance region, thus biasing the input transistor, and hence the second transistor, into immediate conduction. This permits the capacitor to be discharged through the transistors and the tunnel diode to ground, causing a very sharp negative peak to be developed across the output resistor and positively driving the tunnel diode out of conduction in which condition it remains until the next input pulse arrives, since the dropping resistor is of such value that no current is available to cause more than a limited quiescent flow through the tunnel diode between input pulses. An alternative arrangement provides essentially the same operation from an input of the opposite polarity and also provides a Zener diode voltage regulator to permit the use of higher supply voltages without exceeding the breakdown voltages of the transistors.

This invention relates to pulse-generating circuits, and more specifically to a circuit capable of generating high amplitude current pulses having very fast rise times even though initiated by input pulses having relatively slow rise times and low current amplitudes.

There is a need for pulse-generating systems which will generate output pulses having faster rise times than are ordinarily obtained through the conventional biasing on of a transistor. Where the current amplitude requirements have been limited, a tunnel diode switch has often been used to generate fast rise time pulses. Where requirements are such that the pulses generated must not only have extremely fast rise times but also high amplitude currents, avalanche transistors have been used. Such avalanche transistors are capable of generating pulses of about 7 to 10 nanoseconds duration with current peaks in the order of 5 to 7 amperes. Another desirable feature of the avalanche transistor is that it produces pulses having a fairly sharp cut-off characteristic which is essential when dealing with high frequency input signals.

Avalanche transistors have disadvantages as components for high production systems since they are very costly as compared with most conventional transistors, and despite their cost a certain number may not perform as expected, thus requiring careful pre-testing prior to assembly, further increasing the costs connected with using them. They are also limited to NPN types, which limits their flexibility. It is, therefore, an object of the present invention to provide a pulse generator which will produce high amplitude current pulses having extremely fast rise times but which is much less expensive to produce than similar generators using avalanche transistors.

It is another object of the present invention to provide a pulse generator producing high amplitude current pulses having extremely fast rise times and which resets itself very quickly so as to be in condition to receive the next input pulse.

It is a further object of the present invention to provide a pulse generator meeting the above objectives in which standard components having an established high degree of reliability may be used.

It is a further object of the present invention to provide a pulse-generating circuit which, as compared with an avalanche transistor device, can be wired in either the PNP or NPN equivalent form.

Other objects and advantages will become apparent from the following specification taken in connection with the accompanying drawings in which.

Figure 1:
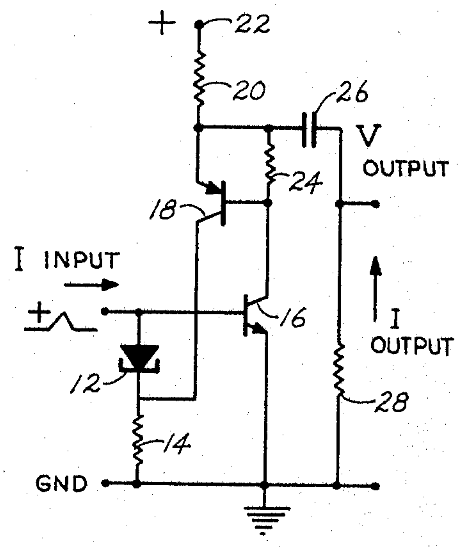
FIGURE 1 is a schematic drawing of a pulse generator incorporating my invention.

Referring now to FIGURE 1, a positive going input pulse is impressed across an input circuit consisting of a tunnel diode 12 and a resistor 14. The input is also connected to the base of a transistor 16. The collector of transistor 16 is connected directly to the base of a transistor 18 thus forming a regeneratively coupled amplifier. The emitter of transistor 18 is connected through a resistor 20 to a source of direct current voltage at a terminal 22. A resistor 24 serves to reduce the possibility that transistor 18 might turn on in the absence of an input pulse due to collector-to-base leakage currents at elevated temperatures. A capacitor 26 is connected between the power source and a load resistor 28.

Figure 3:
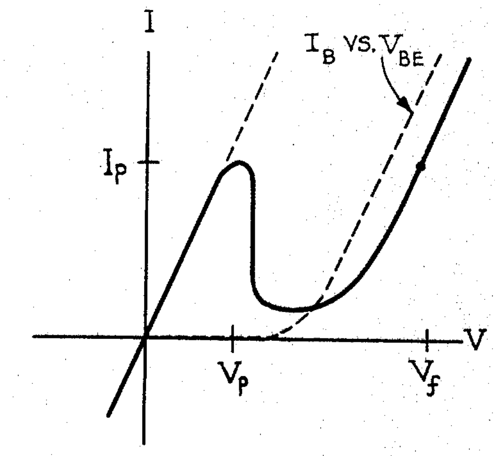
FIGURE 3 is a graph showing the composite current vs. voltage characteristics of the input transistors and the tunnel diodes of FIGURES 1 and 2 as modified by the action of the associated resistors.

Under conditions when there is no output from the trigger generator, the full voltage from terminal 22 appears across capacitor 26 and resistors 20 and 28, thus charging capacitor 26 to its maximum potential. When a positive-going pulse appears at the input, the input voltage rises across tunnel diode 12 and resistor 14. FIGURE 3 shows the composite input voltage vs. current characteristic of tunnel diode 12 and resistor 14 which appears as the solid line. The dotted line continuing upwardly from the first portion of the curve is the characteristic of resistor 14, which limits the rise of the characteristic to a slightly less steep angle than would normally be the case if the tunnel diode alone were used. The additional dotted curve represents the base-emitter voltage vs. current characteristic of transistor 16 ($I_B$ vs. $V_{BE}$). From this graph it may be seen that if the input pulse were applied directly to the base of transistor 16, there would be very little response to increasing voltage until a value is reached where the transistor begins to conduct, after which the current increases rapidly with increasing voltage. This characteristic does not provide a sufficiently fast rise time for some applications. With the tunnel diode 12 in the input, the voltage increases to a lesser value $V_p$ whereupon, due to the negative resistance characteristic of the tunnel diode, it tends to increase almost instantly to value $V_f$ which is a much higher value and which causes the transistor 16 to conduct a significant amount of current instantly.

The transistor 18, having its base directly connected to the collector of transistor 16, is almost simultaneously switched on. Conduction of transistor 18 results in capacitor 26 being discharged through transistor 18, in the reverse direction through tunnel diode 12 and through the base and emitter circuits of transistor 16 to ground. This substantial reverse current results in very positively turning tunnel diode 12 off and stopping the conduction of transistor 16, which subsequently switches transistor 18 off. The discharge of capacitor 26 causes a very sharp negative peak to be developed across output resistor 28. Because of the regeneratively coupled transistors 16 and 18, this output pulse also has a current amplitude comparable to that of pulse generators powered by avalanche transistors. In this application the duration of the input pulse must not exceed the storage time of transistors 16 and 18.

Figure 4:
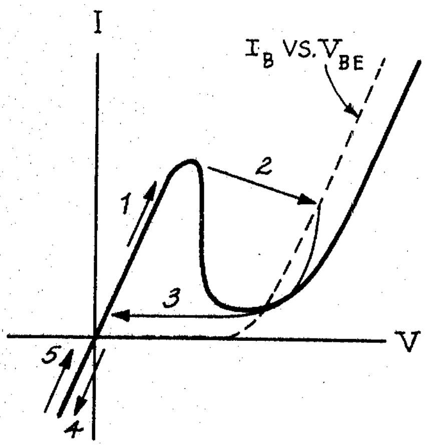
FIGURE 4 is a graph showing the switching sequence of the tunnel diode.

The switching characteristic of my pulse generator is shown in FIGURE 4, which includes the graphs of FIGURE 3 with the switching sequence superimposed. As the input voltage from a positive going input pulse increases across tunnel diode 12 and resistor 14, current flow through the tunnel diode increases very slightly until it reaches the unstable level $I_p$ (curve 1). The corresponding voltage quickly increases from $V_p$ to a much greater value (curve 2) intersecting the transistor characteristic at a point which immediately results in substantial current flow. When capacitor 26 is discharged, the voltage across the tunnel diode decreases very rapidly and approaches the origin (curve 3) except that the continuing discharge through transistor 18 drives the tunnel diode into the negative portion of its characteristic (curve 4) before transistors 16 and 18 are positively shut off, after which the tunnel diode once again returns to its no-voltage condition (curve 5). In this manner it will be appreciated that my pulse generator not only generates pulses having fast rise times and high current densities, but also resets itself very quickly, thus providing assurance that the trailing edge of the output pulse will also be sharp and definite and that the generator will quickly be ready to receive another input pulse.

Figure 2:
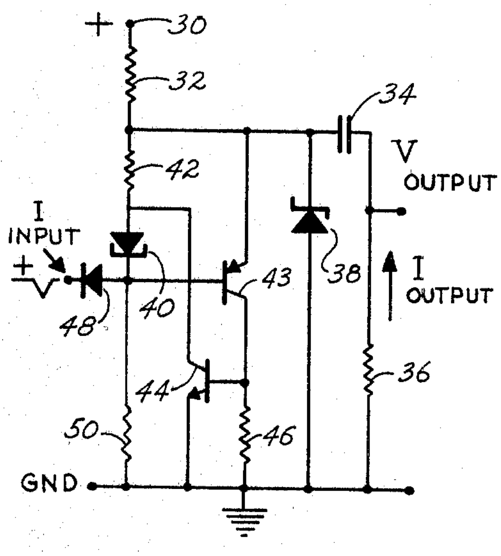
FIGURE 2 is a schematic drawing of a modified form of the device of FIGURE 1.

FIGURE 2 is a schematic drawing of another embodiment of my pulse generator. This embodiment differs from the device of FIGURE 1 principally in two ways: first, it is adapted to receive negative-going input pulses, and secondly, it includes a Zener diode to regulate or "clamp" the voltage across the capacitor such that it is always less than the breakdown voltages of the collector-base junctions of the transistors with the emitter open-circuited ($BV_{CBO}$). This would permit the use of supply voltages greater than the breakdown voltages ($BV_{CBO}$) of the transistors and would also permit control of the amplitude of the output pulse through selection of desired values of the Zener diode. (In FIGURE 1, the voltage across capacitor 26 could not exceed this breakdown voltage.) The positive supply voltage is connected to a terminal 30. A biasing resistor 32 is connected between terminal 30 and a number of parallel connected circuits, one of which includes a capacitor 34 and an output resistor 36. Connected across capacitor 34 and resistor 36 is a Zener diode 38 which acts as a "clamp" or regulator to limit the voltage drop across these components to a value lower than $BV_{CBO}$. Also connected to resistor 32 are a tunnel diode 40 and its associated resistor 42, which are connected in the base circuit of a transistor 43. The base of a second transistor 44 is connected to the collector of transistor 43. A resistor 46 is provided to insure that transistor 44 does not conduct in the absence of an input pulse due to collcetor-to-base leakage currents at elevated temperatures. It may be desirable, in some cases, to incorporate a diode 48 in the input lead. A resistor 50 may be used to increase the quiescent current through tunnel diode 40 to improve its threshold sensitivity. When this resistor is used, diode 48 prevents this current component from being shunted to the input source. It is also effective to prevent the shunting of part of the capacitor discharge into the source.

When a negative-going pulse is supplied to the base of transistor 43, it results in an increasing voltage drop across tunnel diode 40 and resistor 42. When this voltage drop is such that the tunnel diode reaches its peak point current $I_p$, it conducts and the emitter-to-base potential on transistor 43 increases substantially, thereby causing conduction of transistor 43. Current flowing in the collector circuit of transistor 43 immediately turns on transistor 44, thus opening a conduction path extending from the junction between diode 40 and resistor 42 to ground, thus placing this junction at a voltage level only slightly above ground. The charge on capacitor 34 is then discharged through transistor 43, in the inverse direction through tunnel diode 40 and through transistor 44 to ground. This discharge, which causes the output pulse to be generated across resistor 36, also positively resets the circuit as set forth above in the description of FIGURE 1.

While only two embodiments have been shown and described herein, modifications will be apparent to those skilled in the art. It is obvious, of course, that the Zener diode may be used with either the positive- or negative-going input pulse configuration and also that either configuration may be made without the clamping Zener diode. A number of possible biasing arrangements for the tunnel diode may be employed to control sensitivity. The use of the diode 48 is optional, depending upon requirements. It is effective to prevent the shunting of part of the capacitor discharge current into the source. Other modifications may be made, and I do not desire to be limited to the embodiments shown or otherwise than by the following claims.

I claim:

1. A circuit for generating a high current amplitude fast rise time output pulse when actuated by a relatively slow rise time low amplitude current input pulse, comprising:
- a load means;
- a capacitor connected between a source of direct current voltage and said load means;
- an amplifier adapted to receive an input voltage connected to said source and to said capacitor, with the input terminal to said circuit being connected to said amplifier;
- a tunnel diode connected to said input terminal such that when an input pulse is supplied to said input terminal it appears across said tunnel diode causing a large increase in the input voltage to said amplifier, thus causing said amplifier to conduct current with a resulting discharge of said capacitor through said amplifier and in the inverse direction through said tunnel diode, thus resetting said circuit and causing simultaneously a sharp output pulse across said load means.

2. A pulse-generating circuit as set forth in claim 1 wherein voltage-regulating means is connected across said capacitor and said load means.

3. A circuit for generating a high current amplitude fast rise time output pulse when actuated by a source of relatively slow rise time low amplitude current input pulses, comprising:
- load means;
- a capacitor connected between a source of direct current voltage and said load means;
- a pair of transistors of complementary types regeneratively coupled together and connected to said source and to said capacitor, with the input terminal to said circuit being connected to a control electrode of one of said transistors;
- a tunnel diode connected to said input terminal such that when an input pulse is supplied to said input terminal it appears across said tunnel diode causing a large increases in the voltage connected to the control electrode of said one transistor, thus turning on said one transistor which turns on the second transistor with a resulting discharge of said capacitor through said transistors and in the inverse direction through said tunnel diode, thus resetting said circuit and causing simultaneously a sharp output pulse across said load means.

4. A pulse-generating circuit as set forth in claim 3 wherein a Zener diode is connected across said capacitor and said load means.

5. A pulse-generating circuit as set forth in claim 3 wherein unidirectional conduction means is connected to said tunnel diode to prevent said capacitor dishcarge from flowing into the source of said input pulses.

6. A pulse-generating circuit as set forth in claim 5 wherein resistance means is connected in series with said tunnel diode to increase its quiescent current such that its threshold sensitivity is increased.

7. A pulse-generating circuit as set forth in claim 3 wherein resistance means is connected in series with said tunnel diode across the base-emitter function of said first transistor, the base of said second transistor is connected to the collector of said first transistor, said capacitor is connected to the emitter of said second transistor, and the collector of said second transistor is connected to the junction between said resistance means and said tunnel diode.

8. A pulse-generating circuit as set forth in claim 3 wherein resistance means is connected in series with said tunnel diode between said source of direct current voltage and the base of said first transistor, the base of said second transistor is connected to the collector of said first transistor, said capacitor is connected to the emitter of said first transistor, and the collector of said second transistor is connected to the junction between said tunnel diode and said resistance means.

References Cited

UNITED STATES PATENTS

| | | | |
|---|---|---|---|
| 3,121,802 | 2/1964 | Palmer | 307—288 |
| 3,133,210 | 5/1964 | Leurgans | 307—313 XR |
| 3,248,572 | 4/1966 | Widmer | 307—322 XR |
| 3,390,282 | 6/1968 | Cancro et al. | 307—313 XR |

DONALD D. FORRER, Primary Examiner

JOHN ZAZWORSKY, Assistant Examiner

U.S. Cl. X.R.

307—268, 288